United States Patent [19]

Watanabe

[11] 4,205,269
[45] May 27, 1980

[54] REMOTE CONTROL VARIABLE ATTENUATION DEVICE FOR AN ANTENNA AMPLIFIER

[75] Inventor: Masakatsu Watanabe, Akatsukashinmachi, Japan

[73] Assignee: Hochiki Corporation, Tokyo, Japan

[21] Appl. No.: 913,269

[22] Filed: Jun. 7, 1978

[30] Foreign Application Priority Data

Jun. 9, 1977 [JP] Japan ................. 52-75100

[51] Int. Cl.$^2$ ........................... H04N 7/16
[52] U.S. Cl. ........................... 455/4; 358/86
[58] Field of Search ............ 325/62, 309, 394, 308; 340/310 R, 310 A; 358/86, 184, 194

[56] References Cited

U.S. PATENT DOCUMENTS

| 2,679,001 | 5/1954 | Tomcik | 358/184 |
| 3,064,195 | 11/1962 | Freen | 325/308 |
| 3,909,560 | 9/1975 | Martin et al. | 325/308 |

OTHER PUBLICATIONS

D. Lieberman, "Wideband Distribution Equipment for Cable Television (CATV)", Sylvania Bulletion, Jul. 1971, pp. 1-3.

Primary Examiner—James W. Moffitt
Assistant Examiner—Randall P. Myers
Attorney, Agent, or Firm—Sughrue, Rothwell, Mion, Zinn and Macpeak

[57] ABSTRACT

A variable attenuation device is provided for an antenna amplifier by providing high attenuation and low attenuation signal flowpaths connected to the amplifier input by respective pin diodes. The biasing of the diodes and, thus, the attenuation factor provided, is controlled in proportion to the output of a rectifying circuit which, in turn, provides a DC output proportional to the magnitude of a given polarity of the AC signal supplied to the amplifier from inside the subscriber's home.

7 Claims, 6 Drawing Figures

REMOTE CONTROL VARIABLE ATTENUATION DEVICE FOR AN ANTENNA AMPLIFIER

BACKGROUND OF THE INVENTION

This invention relates to a remote control device for a variable attenuation circuit in a television community receiving system.

A TV amplifier built in a casing is usually provided immediately below a TV wave receiving antenna of a television community receiving system extensively employed today. The amplifier comprises a preamplifier, a main amplifier and a gain control device provided between the preamplifier and the main amplifier, the gain control device being generally controlled by a volume type switch. In most of the amplifiers, the power necessary for operating the amplifier is supplied thereto through a signal transmission coaxial cable from a power supply unit provided in the subscriber's house.

Such conventional community receiving system is shown in FIG. 1, which comprises: a television (TV) wave receiving outdoor antenna 1; an amplifier 2; a power supply unit 3; a television set 4; and a coaxial cable CX.

In FIG. 2, which shows the essential components of the conventional amplifier and the power supply unit, reference character $t_1$ designates an input terminal for receiving a reception wave from an antenna (not shown), and reference character $t_2$ designates an output terminal for the amplified reception wave, the output terminal serving also as a power supply input terminal. Between these terminals, a preamplifier 5, a gain control device 6, a main amplifier 7 and a high-pass capacitor $C_6$ are series-connected as shown in FIG. 2. A choke coil $L_{11}$, a diode $D_2$ with its polarity as indicated and a DC power supply section 8 (including a voltage smoothing circuit and a constant voltage circuit) are connected between a point $P_1$, between the terminal $t_2$ and the capacitor $C_6$, and ground. The DC power supply section 8 feeds current to the preamplifier 5 and the main amplifier 7. These components surrounded by the one-dot chain line $l_1$ form a community receiving amplifier 2 and are built in a casing except for a knob of the gain control device (not shown), which is provided on the outside of the casing. The amplifier 2 thus formed is provided immediately below the outdoor antenna on the roof. Components surrounded by the one-dot chain line $l_2$ in FIG. 2 form a power supply unit 3 which is disposed in the subscriber's house or at a position in the vicinity of the house to which the subscriber can readily have access. The power supply unit has terminals $t_3$ and $t_4$. The terminal $t_3$ is connected through a coaxial cable CX to the terminal $t_2$ of the amplifier 2, and it serves as a terminal for receiving signals from the amplifier and also at terminal for supplying current to the amplifier. The terminal $t_4$ is to be connected to a television set (not shown). A high-pass capacitor $C_7$ is connected between the terminals $t_3$ and $t_4$. A choke coil $L_{10}$ and the secondary coil $L_9$ of a transformer are connected in series between ground and a point $P_2$ between the terminal $t_3$ and the capacitor $C_7$. The primary coil $L_8$ of the transformer is connected through a plug to the commercial power supply.

In operation, the 100 V commercial AC power supply voltage is dropped to 20-30 volts by means of the transformer T, which is then applied through the choke coil $L_{10}$ and the coaxial cable CX to the amplifier 2, where it is applied through the choke coil $L_{11}$ to the diode $D_2$, as a result of which it is subjected to half-wave rectification and is then applied to the DC power supply section 8. In the DC power supply section 8, the voltage thus rectified is smoothed and is outputted as a constant voltage to operate the preamplifier 5 and the main amplifier 7. Then, a TV wave received by the outdoor antenna is amplified by the preamplifier 5 and main amplifier 7 and then is applied through the coaxial cable CX and the power supply device 2 to the television set.

When it is judged that the level of an input signal to the television set is improper, the level adjustment has to be carried out. In the typical signal level adjustment method, a signal level measuring device is used for measuring an output signal level from the amplifier 2. In this case, someone has to take it to the place where the amplifier 2 is provided, that is, the roof of the house where the outdoor antenna is mounted. At the roof thereof, the measuring device is connected to the output terminal $t_2$ in order to measure the output signal level from the amplifier 2 and then the output level is adjusted at the proper level by means of the operating knob of the gain control device 6. Furthermore, without the measuring device it is necessary to have the cooperation of many persons. For example, according to the instruction of one person who watches a television, another person who has climbed on the roof operates the knob of the gain control device 6 in order to achieve the adjustment. Both of these two methods are hazardous and troublesome. Further, in the conventional methods, the knob of the gain control device is necessarily protruded from the casing for operation, and this is undesirable with respect to water-proofing.

In addition to the above facts, there is a tendency that the length of the connecting cable becomes longer due to growth of the common antenna television system. This causes a decrease in the output signal level. Therefore, the adjustment of the output signal level of the amplifier must necessarily be frequently carried out.

SUMMARY OF THE INVENTION

Accordingly, and briefly, an object of the present invention is to eliminate the above described drawbacks accompanying the prior art. More specifically, an object of the invention is to provide a remote control device capable of remotely controlling a gain control circuit, that is, a variable attenuation circuit in a television community receiving system, by operating a switch means of a power supply provided indoors while watching the television, instead of operating directly a knob of the gain control device provided in the vicinity of an amplifier which is normally disposed outdoors.

DETAILED DESCRIPTION OF THE PREFERRED EMBODIMENT

Figure 1:
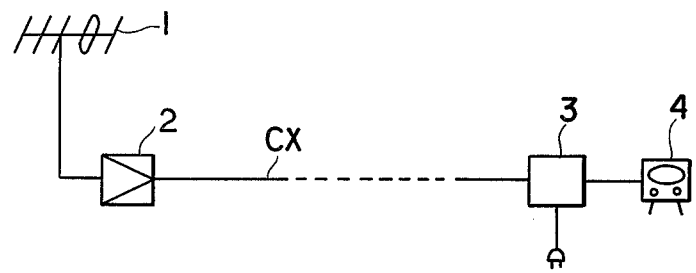
FIG. 1 is a block diagram showing a television community receiving system.
Figure 2:
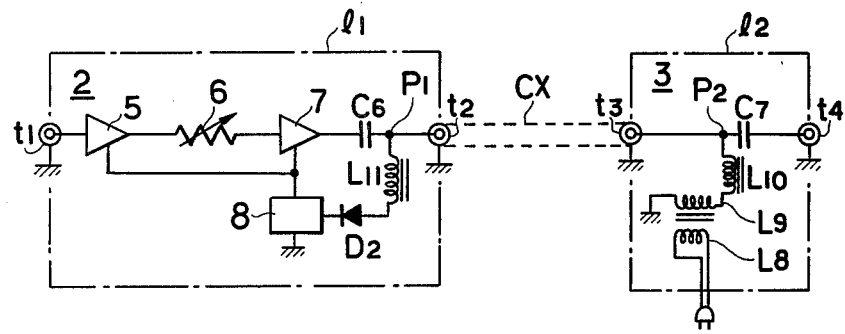
FIG. 2 is a schematic circuit diagram showing a conventional amplifier and a power supply unit.
Figure 3:
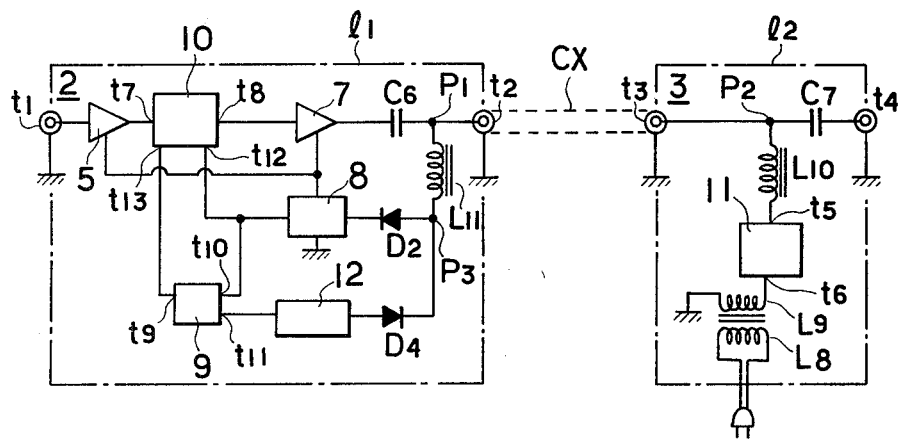
FIG. 3 is a schematic circuit diagram showing an amplifier and a power supply unit according to the present invention.
Figure 4:
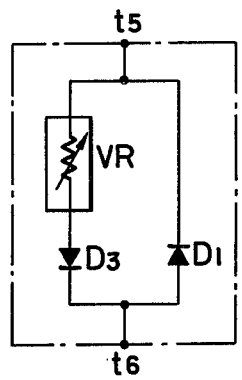
FIG. 4 is a circuit diagram showing a switch operating section designated by reference numeral 11 in FIG. 3.

In FIG. 3 which is a schematic circuit diagram showing an amplifier and a power supply unit according to the present invention, the power supply unit 3 surrounded by a one-dot chain line $l_2$ is roughly similar to the conventional power supply unit shown in FIG. 2. However, the former is differnt from the latter in that a switch operation section 11 is connected between a choke coil $L_{10}$ and the secondary coil $L_9$ of a transformer. Diodes $D_1$ and $D_3$ opposite in polarity are parallel-connected between the terminals $t_5$ and $t_6$ of the switch operating section 11 as shown in FIG. 4. A variable resistor VR is series-connected between the terminal $t_5$ and the diode $D_3$ so as to control current flowing to the variable attenuation circuit in the amplifier 2. More specifically, when a value of the variable resistor VR is placed at the minimum value, current caused by the voltage having one polarity of the commercial power supply input flows through the diode $D_3$ and then it is outputted by the power supply unit. By contrast, when the value of the variable resistor VR is gradually increased, the current decreases in proportion to the variation in the value of the resistor VR. This current is fed to the amplifier 2, and it is employed for controlling the variable attenuation circuit. The other diode $D_1$ is provided for supplying an operating power to the amplifier 2. The diode $D_1$ allows the voltage having the opposite polarity to pass therethrough to the amplifier 2.

In the amplifier 2 which is surrounded by a one-dot chain line $l_1$ in FIG. 3, instead of the gain control device 6 shown in FIG. 2, a bridged T type variable attenuation circuit shown in FIG. 6 and described hereinafter is connected between the preamplifier 5 and the main amplifier 7. Furthermore, a diode $D_4$ having its polarity as indicated and a rectifier 12 are connected in series between a point $P_3$, between the choke coil $L_{11}$ and the diode $D_2$, and ground. A control circuit 9 is provided at the output side of the rectifier 12.

Figure 5:
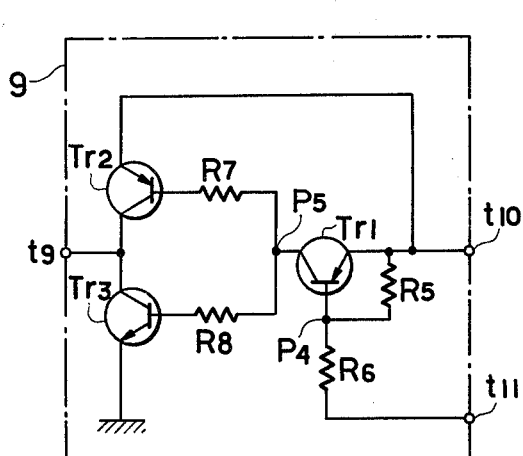
FIG. 5 is a circui-diagram showing a control section designated by reference numeral 9 in FIG. 3.

In FIG. 5 which shows a circuit diagram of the above mentioned control circuit 9, there are provided two input terminals $t_{10}$ and $t_{11}$ the former of which is connected to the emitter of a switching transistor $Tr_1$ and the latter of which is connected through a resistor $R_6$ to the base of the transistor $Tr_1$. A resistor $R_5$ is parallel-connected between the emitter and the base of the transistor $Tr_1$. The collector of the transistor $Tr_1$ is connected through a resistor $R_7$ to the base of a transistor $Tr_2$ and is further connected through a resistor $R_8$ to the base of a transistor $Tr_3$. The emitter of the transistor $Tr_2$ is connected to the input terminal $t_{10}$ and the emitter of the transistor $Tr_3$ is connected to ground. Furthermore, the collectors of the respective transistors $Tr_2$ and $Tr_3$ are connected to a common output terminal $t_9$.

In operation, when the resistance value of the variable resistor VR included in the switch operating section 11 is increased, electric potential at the point $P_4$ of the control circuit 9, that is, the base potential of the transistor $Tr_1$ increases. As a result, the transistor $Tr_1$ will be turned-off and electric potential at the point $P_5$ between the resistors $R_7$ and $R_8$ becomes that of ground. Accordingly, the transistor $Tr_2$ turns-on and the transistor $Tr_3$ turns-off, as a result of which positive voltage $+V$ which is almost equal to that of the DC power supply section 8, is outputted from the output terminal $t_9$. By contrast, when the resistor value of the variable resistor VR is reduced, the potential at the point $P_4$ of the control circuit decreases, as a result of which the transistor $Tr_1$ turns-on and the electric potential at the point $P_5$ becomes almost equal to the positive voltage $+V$. Accordingly, the transistor $Tr_2$ turns-off and the transistor $Tr_3$ turns-off, as a result of which a voltage which is almost equal to that of ground, is outputted from the output terminal $t_9$.

Figure 6:
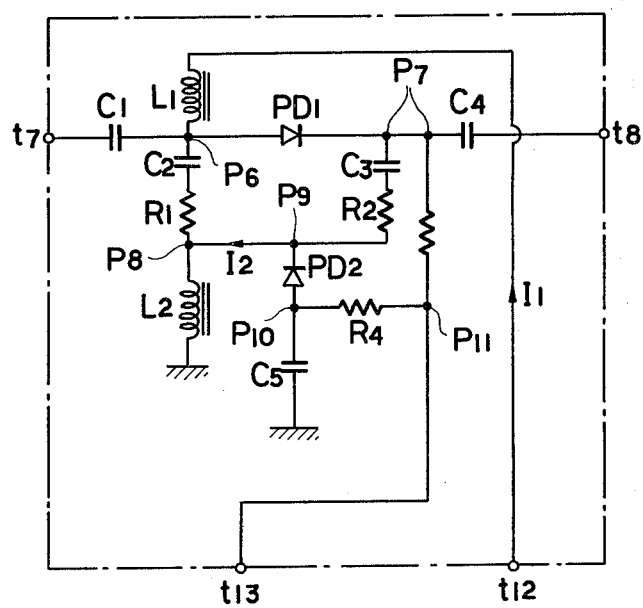
FIG. 6 is a circuit diagram showing a variable attenuation circuit designated by reference numeral 10 in FIG. 3.

In FIG. 6 which shows the circuit diagram of the bridged T type variable attenuation circuit 10, reference characters $t_7$ and $t_8$ designate TV wave input and output terminals, respectively. A series-circuit of a capacitor $C_1$, a pin diode $PD_1$ having its polarity as indicated and a capacitor $C_4$ is connected between the input terminal $t_7$ and the output terminal $t_8$. A series-circuit of a capacitor $C_2$, a resistor $R_1$ and a choke coil $L_2$ for blocking a high-frequency signal is connected between a point $P_6$, between the capacitor $C_1$ and the pin diode $PD_1$, and ground. A choke coil $L_1$ for blocking a high-frequency signal is connected between the point $P_6$ and the input terminal $t_{12}$. A series-circuit of a capacitor $C_3$, a resistor $R_2$, a pin diode $PD_2$ having its polarity as indicated and a capacitor $C_5$ is connected between a point $P_7$, between the pin diode $PD_1$ and the capacitor $C_4$, and ground. A point $P_9$ between the resistor $R_2$ and the pin diode $PD_2$ is connected to a point $P_8$ between the resistor $R_1$ and the choke coil $L_2$. Furthermore, a series-circuit of the resistors $R_3$ and $R_4$ is connected between a point $P_{10}$, between the pin diode $PD_2$ and the capacitor $C_5$, and the point $P_7$. A point $P_{11}$ between the resistors $R_3$ and $R_4$ is connected to an input terminal $T_{13}$.

In operation, in the case where it is judged that an input signal level to the television is high while watching the television, the resistance value of the variable resistor VR included in the power supply unit 3 is increased, as a result of which a voltage which is almost equal to the output voltage $+V$ of the DC power supply section 8 is outputted from the output terminal $t_9$ of the control circuit 9 and it is applied to the input terminal $t_{13}$ of the variable attenuation circuit 10. On the other hand, the positive voltage $+V$ of the DC power supply section 8 is also applied to the input terminal $t_{12}$. Under this condition, a biasing current $I_1$ for biasing the pin diode $PD_1$ which flows in the path of $t_{12} \rightarrow L_1 \rightarrow PD_1 \rightarrow R_3 \rightarrow t_{13}$, is small and a biasing current $I_2$ for biasing the pin diode $PD_2$, which flows in the path $t_{13} \rightarrow R_4 \rightarrow PD_2 \rightarrow L_2 \rightarrow$ ground, becomes large.

As is apparent from the characteristics of a pin diode, the alternating resistance, that is, the resistance against the TV wave signal of the pin diode $PD_1$ is large. By contrast, an alternating resistance of the pin diode $PD_2$ is small. Accordingly, the attenuation factor becomes large, as a result of which the output signal level ouputted from the terminal $t_2$ of the amplifier 2 is attenuated, that is the input signal level inputted to the television is attenuated and is adjusted to a proper level.

When it is judged that the input signal level inputted to the television is lower than a proper level, the resistance value of the variable resistor VR is decreased. According to the decreasing of the resistance, the voltage which is almost equal to that of ground is outputted from the output terminal $t_9$ of the control circuit 9 and it is then applied to the input terminal $t_{13}$ of the variable attenuation circuit 10. On the contrary, the positive voltage $+V$ outputted from the DC power supply section 8 is applied to the input terminal $t_{12}$. Under this condition, the biasing current for biasing the pin diode $PD_1$, which flows in the path of $t_{12} \rightarrow L_1 \rightarrow PD_1 \rightarrow R_3 \rightarrow t_{13}$, is large. By contrast, the biasing current $I_2$ for biasing the pin diode $PD_2$, which flows in the path of $t_{13} \rightarrow R_4 \rightarrow PD_2 \rightarrow L_2 \rightarrow$ ground, is small. As a result, the alternating resistance of the pin diode $PD_1$ is small and the alternating resistance of the pin diode $PD_2$ is large. Accordingly, the attenuation factor becomes small and the output signal level outputted from the terminal $t_2$ of the amplifier 2 increases. Consequently, the input signal level to the television increases and is adjusted to the proper level. Therefore, according to the present invention, it is possible to adjust the output signal level of the amplifier to the proper level by operating the variable resistor included in the power supply section provided indoors while watching the television. Consequently, the subscriber can always watch the television under the best conditions.

As was described before, heretofore if the controlling knob of the attenuation circuit provided in the amplifier is operated to adjust the TV wave input signal level to the proper level, the troublesome operation of someone climbing up on the roof to operate the knob must be carried out. However, according to the present invention, it is possible to freely adjust the input TV signal level to the proper level from inside the building without special lines and devices, merely by adding a simple circuit to the conventional amplifier and power supply unit. In the conventional method, the knob for adjusting the input TV signal level is necessarily protruded from the casing for operation; however, this is undesirable with respect to water-proofing. On the other hand, in the present invention, it is unnecessary to provide the amplifier with the protruded knob therefrom and, therefore, the water-proofing of the casing can be made perfect. Furthermore, even if the number of the television sets sharing the system increases and the television sets are moved from one plate to another, according to the present invention it is very easy to adjust the TV wave input signal. The variety of advantages of the present invention should be well appreciated.

It should be appreciated that various changes and modifications could be made to the embodiment shown and described without departing from the spirit of the invention, for example, the generation of a signal for controlling the variable attenuation circuit could be performed in response to the absence, rather than presence of one half of the power signal. Also, the positive rather than negative half cycle could be used to control attenuation. Furthermore, a number of equivalent circuits for converting the half cycle AC signal to a DC control signal could be used in place of the diode $D_4$, rectifying and smoothing circuit 12 and control circuit 9.

What is claimed is:

1. A remote control device for a variable attenuation circuit in an amplifier which is inserted in a signal transmission line in the vicinity of a television community receiving system antenna and is energized through said signal transmission line by a power supply unit in a subscriber's house, comprising:
   a first diode in said power supply unit for supplying a first half cycle of an A.C. power supply signal to said amplifier;
   a second diode in said power supply unit for supplying the second half cycle of said A.C. power supply signal to said amplifier;
   a variable resistor in the power supply unit for varying the amount of said second half cycle signal supplied by said second diode;
   a DC power supply section in said amplifier which receives the first half cycle signal from said first diode and supplies said first half cycle signal as an amplifier power signal to an amplifier section; and
   an attenuation control means in said amplifier for varying the attenuation factor of said variable attenuation circuit in correspondence to the amount of said second half cycle signal supplied by said second diode.

2. A remote control device according to claim 1, wherein said attenuation control means comprises an attenuation control signal generating means for receiving said second half cycle signal and providing a DC attenuation control signal having a magnitude corresponding to the magnitude of said second half cycle signal.

3. A remote control device according to claim 2, wherein said variable attenuation circuit receives said amplifier power signal as a first bias signal and said attenuation control signal as a second bias signal and the attenuation factor of said variable attenuation circuit is varied in correspondence to the relative magnitudes of said first and second bias signals.

4. A remote control device according to claim 3, wherein said variable attenuation circuit comprises:
   a first attenuation signal path connected to said signal transmission line and including a third diode;
   a second attenuation signal path connected to said signal transmission line and including a fourth diode;
   means for supplying said first bias signal as a DC bias signal of substantially constant magnitude to one terminal of said fourth diode; and
   means for supplying said second bias signal to the other terminal of said fourth diode and to one terminal of said third diode so that the conductions of said third and fourth diodes and, thus, the AC impedances of said first and second attenuation signal paths, respectively, are substantially determined by the magnitude of said second bias signal.

5. A remote control device according to claim 4, wherein said third and fourth diodes are pin diodes.

6. A remote control device according to claims 1, 2, 3 or 4, wherein said second half cycle is the negative half cycle of said AC power supply signal.

7. A remote control device according to claims 1, 2, 3 or 4, wherein said second half cycle is the positive half cycle of said AC power supply signal.

* * * * *